(12) United States Patent
Kino et al.

(10) Patent No.: US 8,180,002 B2
(45) Date of Patent: May 15, 2012

(54) DIGITAL SIGNAL PROCESSING DEVICE, DIGITAL SIGNAL PROCESSING METHOD, AND DIGITAL SIGNAL PROCESSING PROGRAM

(75) Inventors: Yasuyuki Kino, Tokyo (JP); Tokihiko Sawashi, Tokyo (JP)

(73) Assignee: Sony Corporation, Tokyo (JP)

( * ) Notice: Subject to any disclaimer, the term of this patent is extended or adjusted under 35 U.S.C. 154(b) by 784 days.

(21) Appl. No.: 12/214,082

(22) Filed: Jun. 17, 2008

(65) Prior Publication Data

US 2009/0003497 A1 Jan. 1, 2009

(30) Foreign Application Priority Data

Jun. 26, 2007 (JP) .................. 2007-168117

(51) Int. Cl.
*H04B 1/10* (2006.01)
(52) U.S. Cl. ........ 375/346; 375/285; 375/286; 375/287; 375/350
(58) Field of Classification Search .................... 375/346
See application file for complete search history.

(56) References Cited

U.S. PATENT DOCUMENTS 4,949,177 A * 8/1990 Bannister et al. ............. 348/584
6,256,395 B1 * 7/2001 Melanson ..................... 381/312

FOREIGN PATENT DOCUMENTS

| CN | 1396718 A | 2/2003 |
| CN | 1809044 A | 7/2006 |
| JP | 08-293750 | 11/1996 |
| JP | 2000-211512 A | 8/2000 |

OTHER PUBLICATIONS

Japan Patent Publication 2007-150581, published on Jun. 14, 2007.*
Japan Patent Publication 7-66687, published on Mar. 10, 1995.*

* cited by examiner

*Primary Examiner* — Siu Lee
(74) *Attorney, Agent, or Firm* — Wolf, Greenfield & Sacks, P.C.

(57) ABSTRACT

The present invention provides a digital signal processing device that considerably reduces a return noise generated in a processing result signal in specific signal processing without wastefully increasing the processing load. There is provided a digital signal processing device that executes specific signal processing under which a return noise is generated in a processing result signal which includes an up-sampling processing unit that performs the up-sampling processing for a digital signal with a predetermined up-sampling rate to generate an up-sampling signal, a specific signal processing unit that performs the specific signal processing for the up-sampling signal generated by the up-sampling processing unit to generate the processing result signal, and a down-sampling processing unit that performs the down-sampling processing for the processing result signal generated by the specific signal processing unit with a predetermined down-sampling rate to generate a down-sampling signal.

6 Claims, 12 Drawing Sheets

DIGITAL SIGNAL PROCESSING DEVICE, DIGITAL SIGNAL PROCESSING METHOD, AND DIGITAL SIGNAL PROCESSING PROGRAM

CROSS REFERENCES TO RELATED APPLICATIONS

The present invention contains subject matter related to Japanese Patent Application JP2007-168117 filed in the Japanese Patent Office on Jun. 26, 2007, the entire contents of which being incorporated herein by reference.

BACKGROUND OF THE INVENTION

1. Field of the Invention

The present invention relates to a digital signal processing device, a digital signal processing method, and a digital signal processing program which are preferably applied to a reproduction device to be mounted on a vehicle in which a digital signal processor (DSP) as a digital signal processing device is mounted.

2. Description of the Related Art

A hitherto known signal processing device samples an analog signal with the cycle of a predetermined sampling frequency using an analog-digital converter. In this way, the signal processing device generates a digital signal which is a data row of discrete data represented by digitalizing a value at an individual sampling point of an analog signal using the analog-digital converter. Then, the signal processing device sends the digital signal to a DSP and performs signal processing for the digital signal.

On the other hand, in the signal processing device, when a signal component of a frequency which is higher than the Nyquist frequency whose frequency is ½ of a sampling frequency with respect to an analog signal is included, for a digital signal generated by sampling the analog signal, a signal component of a frequency which is higher than the Nyquist frequency is returned with the Nyquist frequency being the border to generate a return noise which has its frequency converted to another frequency. The return noise generated in a digital signal is different from a signal component of a primary frequency included in the digital signal, and is a signal component which is hard to differentiate from a signal component of the primary frequency.

In the signal processing device, when performing signal processing for a digital signal in which a return noise is generated in a DSP, the return noise is wrongly detected as a signal component of a primary frequency of a digital signal, and, as a result, there is a fear of malfunction. Accordingly, the signal processing device controls the frequency band of the analog signal to the Nyquist frequency or lower by making the analog signal pass through a lowpass filter, and performs the sampling to generate a digital signal. In this way, the signal processing device prevents a return noise from occurring in a digital signal (refer to, e.g., Jpn. Pat. Appln. Laid-Open Publication No. 2000-211512 [page 2, FIG. 2]).

SUMMARY OF THE INVENTION

Meanwhile, in the thus configured signal processing device, a DSP is so configured as to operate in synchronization with the cycle of a predetermined operation sampling frequency such as 48 KHz which has been selected previously. Furthermore, in the signal processing device, the DSP takes in a digital signal including a signal component of a frequency whose frequency is equal to or lower than ½ of an operation sampling frequency (referred to as return frequency, hereinafter), and performs various signal processing.

In these days, as signal processing to be executed by a DSP, there is processing in which, for example, by processing a digital signal which has its high-frequency component (that is, signal component of comparatively high frequency band) deleted, and generating a signal component of a comparatively high frequency, the deleted high-frequency component is interpolated. However, among the signal processing, there is specific processing in which, when a digital signal is processed, a signal component of a frequency which is higher than the return frequency is generated. Then, when the DSP executes specific signal processing which generates a signal component of a frequency higher than the return frequency (referred to as specific signal processing, hereinafter), in a processing result signal which is obtained as a result of the processing, a signal component of a frequency higher than the return frequency is returned with the return frequency being the border to generate a return noise which has its frequency converted to another frequency.

A processing result signal which is obtained when a DSP actually operates with a first operation sampling frequency Fs1 of, for example, 48 KHz, and executes the specific signal processing in which a return noise is generated will be explained referring to FIG. 1. As shown in FIG. 1, in the processing result signal obtained by the specific signal processing, when expressing part of a signal component of the processing result signal as a spectrum, a signal component SI1 of a frequency equal to or lower than a first return frequency (that is, 24 KHz) whose frequency is ½ of the first operation sampling frequency Fs1 is included intact. Furthermore, in the processing result signal, signal components S12 and S13 of frequencies which are higher than a first return frequency are returned with the first return frequency being the border to generate return noises AN1 and AN2 which have their frequencies converted to other frequencies.

In this way, the return noises AN1 and AN2 generated in the processing result signal have signal components which are different from a signal component of the primary frequency included in the processing result signal, and are hard to differentiate from a signal component of the primary frequency. Accordingly, in the signal processing device, when the DSP generates a processing result signal in which the return noises AN1 and AN2 are generated, and performs another signal processing for the processing result signal continuously, there is a fear that a processing result different from a desired processing result is obtained.

Accordingly, in the signal processing device, in case the DSP executes the specific signal processing in which the return noise is generated in the processing result signal, it is desired that the return noises AN1 and AN2 generated in the processing result signal are reduced in the specific signal processing. Accordingly, as a method to reduce the return noises AN1 and AN2 generated in the processing result signal in the specific signal processing (referred to as return noise reduction method, hereinafter), there can be considered a method of making the DSP operate in synchronization with the cycle of a second operation sampling frequency of N (integer) times such as two times the above-described first operation sampling frequency Fs1.

That is, as shown in FIG. 2, in the return noise reduction method, by raising the first operation sampling frequency Fs1 to the second operation sampling frequency Fs2 of N times (for example, 96 KHz of two times) in the DSP, accordingly, the return frequency as the border where the return noises AN1 and AN2 are generated in the processing result signal is raised from the first return frequency to the second return frequency of N times (for example, 48 KHz of two times). Then, according to the return noise reduction method, when expressing as a spectrum part of a signal component of the processing result signal which is obtained from the specific signal processing by operating the DSP with the second operation sampling frequency Fs2, in the processing result signal, the signal component SI1 of a frequency equal to or lower than the first return frequency is included intact similar to the above-described case.

In the processing result signal, even signal components SI2 and SI3 whose frequency is higher than the first return frequency, in case the frequency is lower than the second return frequency, the signal components do not become return noises and are included intact. In this way, in the known return noise reduction method, by turning up the operation sampling frequency of the DSP, the return noises AN1 and AN2 generated in the processing result signal can be reduced in the specific signal processing.

On the other hand, in the signal processing device, there is a case in which the DSP does not execute only the specific signal processing, and executes other signal processing in addition to the specific signal processing. When the DSP is so configured as to execute plural signal processing, the operation sampling frequency is not changed for each signal processing, and when any one of the signal processing is executed, the DSP operates in synchronization with the cycle of the second operation sampling frequency Fs2.

Accordingly, in the DSP which employs the return noise reduction method, signal processing whose operation sampling frequency does not have to be set so high fundamentally is executed in synchronization with the cycle of the comparatively high operation sampling frequency. As a result, in the DSP, in the signal processing in which the operation sampling frequency does not have to be set so high, the signal processing amount per unit time is wastefully increased, which wastefully increases the processing load.

Accordingly, it is desired in the DSP which executes the specific signal processing that the return noises AN1 and AN2 generated in the processing result signal are reduced in the specific signal processing without wastefully increasing the processing load. However, there is a problem that the DSP is insufficient when reducing the return noises AN1 and AN2 generated in the processing result signal in the specific signal processing without wastefully increasing the processing load.

In view of the above-identified circumstances, it is therefore desirable to provide a digital signal processing device, a digital signal processing method, and a digital signal processing program which can considerably reduce a return noise generated in a processing result signal in specific signal processing without wastefully increasing the processing load.

According to an embodiment of the present invention, there is provided a digital signal processing device that executes specific signal processing under which a return noise is generated in a processing result signal. In the digital signal processing device, an up-sampling processing unit performs the up-sampling processing for a digital signal with a predetermined up-sampling rate to generate an up-sampling signal, a specific signal processing unit performs the specific signal processing for the up-sampling signal generated by the up-sampling processing unit to generate the processing result signal, and a down-sampling processing unit performs the down-sampling processing for the processing result signal generated by the specific signal processing unit with a predetermined down-sampling rate to generate a down-sampling signal.

According to the present invention, in the digital signal processing device, the up-sampling processing is performed for the digital signal at the preceding stage of the specific signal processing to increase the number of data, and the down-sampling processing is performed for the processing result signal at the subsequent stage of the specific signal processing to decrease the number of data. Accordingly, apparently, only the specific signal processing can be executed with the cycle of an operation sampling frequency which is higher than a primary operation sampling frequency.

According to the present invention, it becomes possible to realize a digital signal processing device, a digital signal processing method, and a digital signal processing program which can considerably reduce the return noise generated in the processing result signal in the specific signal processing without wastefully increasing the processing load.

The nature, principle and utility of the invention will become more apparent from the following detailed description when read in conjunction with the accompanying drawings in which like parts are designated by like reference numerals or characters.

DETAILED DESCRIPTION OF THE PREFERRED EMBODIMENTS

Now, an embodiment of the present invention will be described in greater detail by referring to the accompanying drawings.

Figure 1:
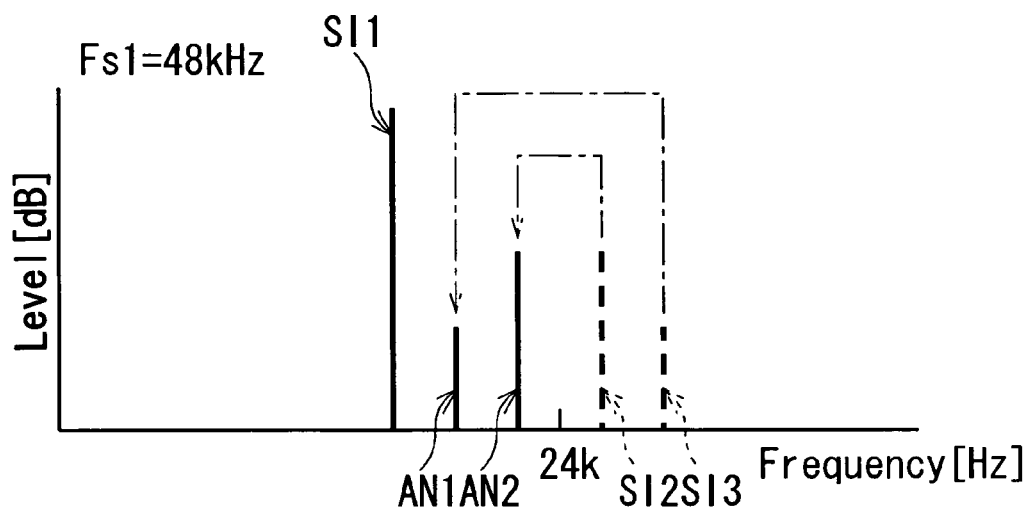
FIG. 1 shows a schematic view to explain a return noise generated in a processing result signal.
Figure 2:
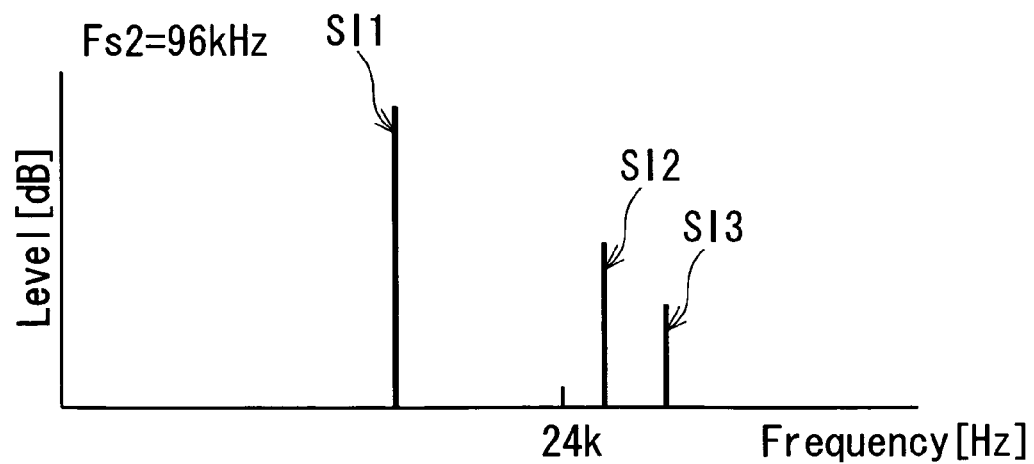
FIG. 2 shows a schematic view to explain a return noise reduction method in the known specific signal processing.
Figure 3:
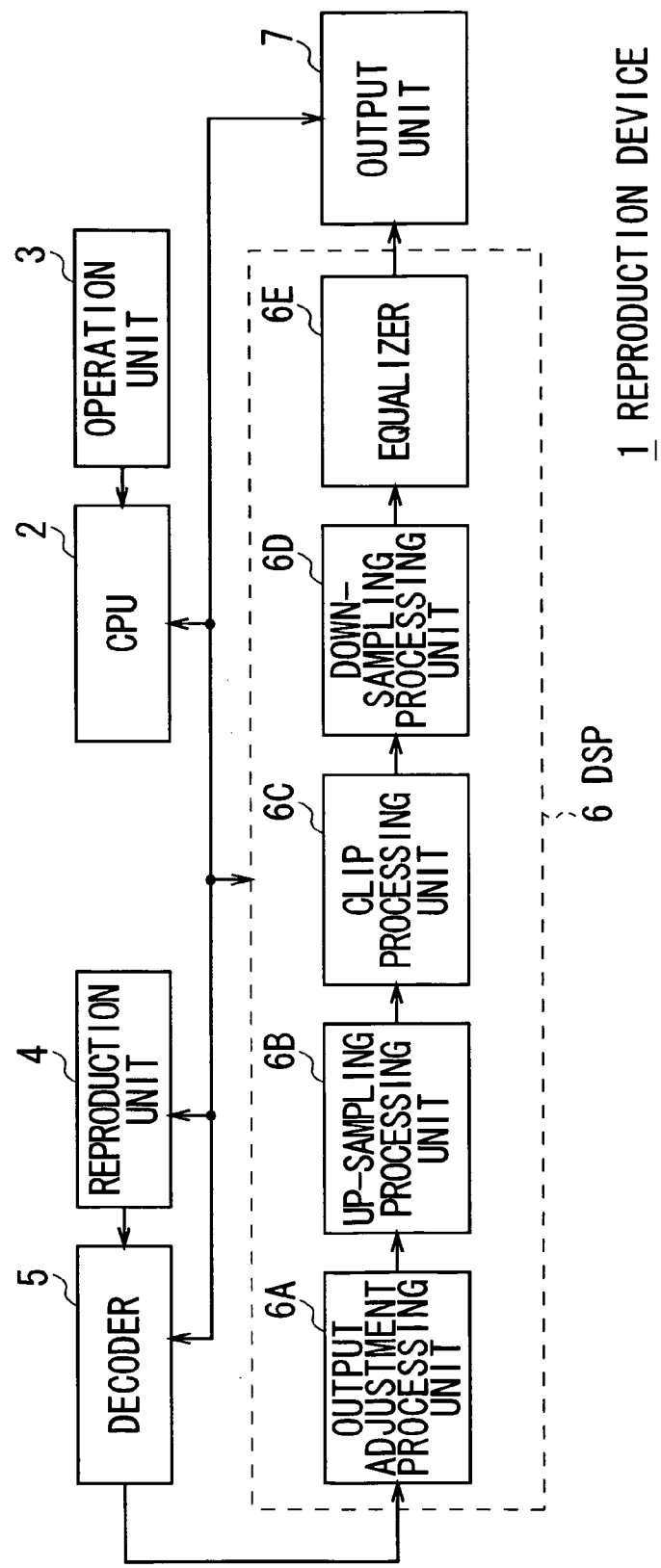
FIG. 3 shows a block diagram indicative of the circuit configuration of a reproduction device according to an embodiment of the present invention.

In FIG. 3, a reference numeral 1 represents a reproduction device to be mounted on a vehicle which employs the present invention. The reproduction device 1 can load an optical disc (not shown) such as a Compact Disc-Recordable (CD-R), a Compact Disc-Rewritable (CD-RW). On the optical disc, by a recording device such as an external personal computer, a digital signal of music which is a data row of discrete data is recorded in accordance with the Pulse Code Modulation (PCM) format as a compressed encoded digital signal which is encoded (that is, compression encoding processing) under the MPEG Audio Layer-3 (MP 3) format to be generated.

In the reproduction device 1, when various commands are input by the user operation to an operation unit 3 such as various operation keys and a remote controller arranged in the housing of the reproduction device 1, a CPU 2 controls the entire reproduction device 1 according to thus input various commands. Accordingly, when a reproduction command is input by the user operation to the operation unit 3 in a state in which an optical disc is loaded to the reproduction device 1, a reproduction unit 4 reads out a compressed encoded digital signal from the optical disc, and sends thus read out signal to a decoder 5.

The decoder 5 decodes (that is, decoding expansion processing) a compressed encoded digital signal sent from the reproduction unit 4 in accordance with, for example, the MP 3 format, and generates a digital signal of music (referred to as music digital signal hereinafter). In this case, at the subsequent stage of the decoder 5, a DSP 6 that operates in synchronization with the cycle of a first operation sampling frequency such as, for example, 48 KHz is arranged. Accordingly, the decoder 5 generates a music digital signal as a data row of discrete data sampled under a sampling rate (referred to as first sampling rate, hereinafter) being a frequency (referred to as return frequency, hereinafter) such as 24 KHz which is ½ of the first operation sampling frequency. Then, the decoder 5 sends thus generated music digital signal to the DSP 6.

As described above, the DSP 6 operates in synchronization with the cycle of the first operation sampling frequency. Then, the DSP 6 executes various signal processing by realizing various functions in accordance with various programs such as a digital signal processing program which has been previously stored in a memory (not shown) arranged at the inside thereof. In the following explanation however, for the sake of convenience, by setting various functions which the DSP 6 realizes in accordance with various programs in the software manner as a function circuit block, various signal processing executed by the DSP 6 will be explained.

The DSP 6 takes in a music digital signal sent from the decoder 5 to an output adjustment processing unit 6A. The output adjustment processing unit 6A performs time alignment processing to correct the deviance of arrival time of music due to the difference of distance from a plurality of respective loudspeakers arranged in a vehicle to the listening point for the music digital signal sent from the decoder 5. Furthermore, the output adjustment processing unit 6A also performs bass management processing to set the output distribution of bass according to the ability of the plural loudspeakers arranged in the vehicle for the music digital signal. Then, the output adjustment processing unit 6A sends the music digital signal, for which output adjustment processing such as the time alignment processing or bass management processing is performed, to an up-sampling processing unit 6B.

The up-sampling processing unit 6B up-samples the music digital signal sent from the output adjustment processing unit 6A under a sampling rate (referred to as up-sampling rate, hereinafter) which is, for example, two times greater than the first sampling rate. Accordingly, the up-sampling processing unit 6B generates a music digital signal (referred to as up-sampling signal, hereinafter) which is up-sampled from the first sampling rate to the up-sampling rate.

Figure 4:
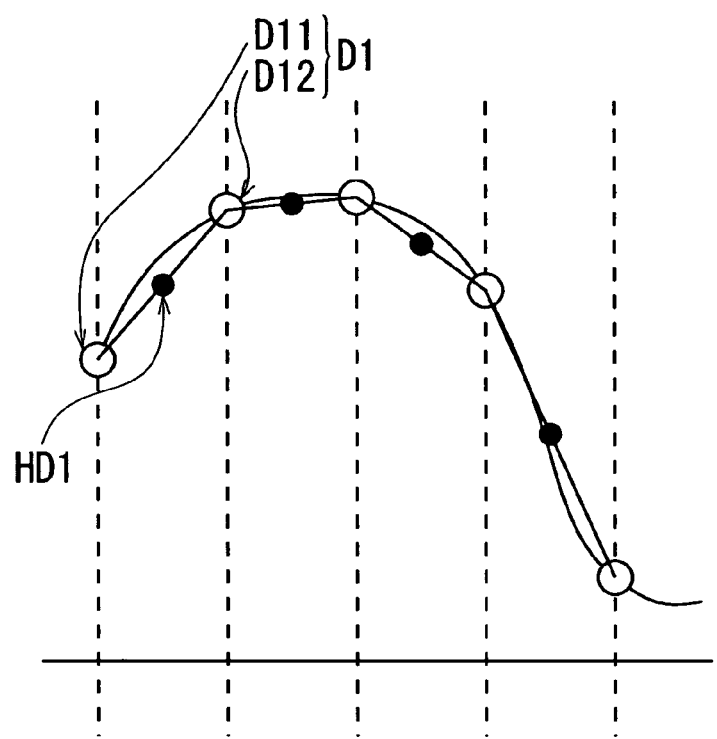
FIG. 4 shows a schematic view to explain the up-sampling processing.

That is, as shown in FIG. 4, the up-sampling processing unit 6B takes in the music digital signal from the output adjustment processing unit 6A in series as discrete individual data D1 (that is, discrete individual data configuring music digital signal, and shown as white circles in FIG. 4) in synchronization with the cycle of the first operation sampling frequency, and temporarily retains thus taken in data D11 for a predetermined time period respectively. Furthermore, every time the discrete individual data D1 of the music digital signal is taken in, the up-sampling processing unit 6B calculates data HD1 (that is, shown as black circles in FIG. 4) which is the intermediate value between the value of the data D11 which has been taken in previous time and temporarily retained and the value of data D12 which is taken in this time.

In this way, the up-sampling processing unit 6B interpolates the data HD1 of the intermediate value between the data D11 which has been taken in previous time with respect to the music digital signal and temporarily retained and the data D12 which is taken in this time. Accordingly, the up-sampling processing unit 6B generates the up-sampling signal in which the data number of the music digital signal is increased by, for example, two times. Then, as the up-sampling signal in synchronization with the cycle of the first operation sampling frequency, the up-sampling processing unit 6B sends two data or the data D11 which has been taken in previous time and temporarily retained and the new data HD1 obtained by the interpolation using the data D11 to a clip processing unit 6C at the subsequent stage in series.

Figure 5:
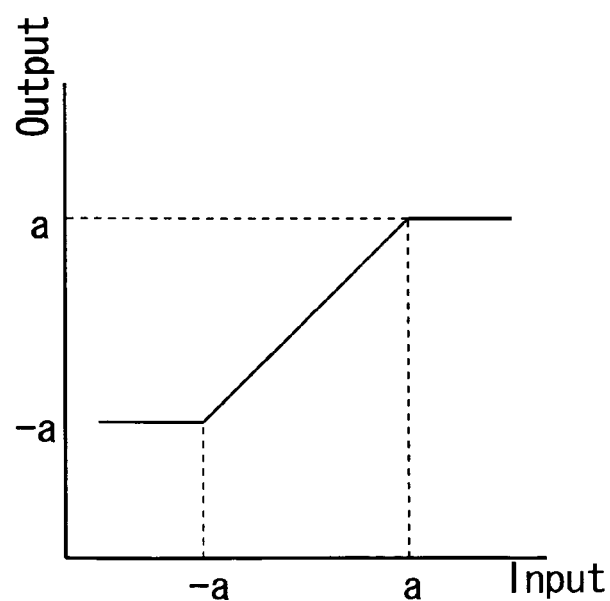
FIG. 5 shows a schematic view to explain the clip processing (1)

As shown in FIG. 5, in synchronization with the cycle of the first operation sampling frequency, the clip processing unit 6C sequentially takes in discrete data of the up-sampling signal by two from the up-sampling processing unit 6B. Then, every time the discrete two data of the up-sampling signal is taken in, concurrently and parallelly for the two data, the clip processing unit 6C performs the clip processing as the specific signal processing in which a return noise is generated.

When taking in the discrete two data of the up-sampling signal and performs the clip processing, the clip processing unit 6C actually compares the respective levels of the two data with a first level (a) which is a previously selected plus side threshold value in the clip processing. Furthermore, the clip processing unit 6C compares the respective levels of the two data with a second level (−a) which is a previously selected minus side threshold value lower than the first level in the clip processing. As a result, when the level of the discrete data of the up-sampling signal is equal to or greater than the second level (−a) and is equal to or less than the first level (a), the clip processing unit 6C does not change the level of the data.

On the other hand, when the level of the discrete data of the up-sampling signal is greater than the first level (a), the clip processing unit 6C turns down the level of the data to the first level (a) to restrict it. Furthermore, when the level of the discrete data of the up-sampling signal is less than the second level (−a), the clip processing unit 6C turns up the level of the data to the second level (−a) to restrict it. In this way, the clip processing unit 6C performs the clip processing which arbitrarily restricts the level of the discrete data for the up-sampling signal, and generates a processing result signal S2 of digital which is a data row of discrete data.

The clip processing to be executed by the DSP 6 will be explained in detail. The music digital signal which the DSP 6 processes includes signal components of various frequencies.

Figure 6:
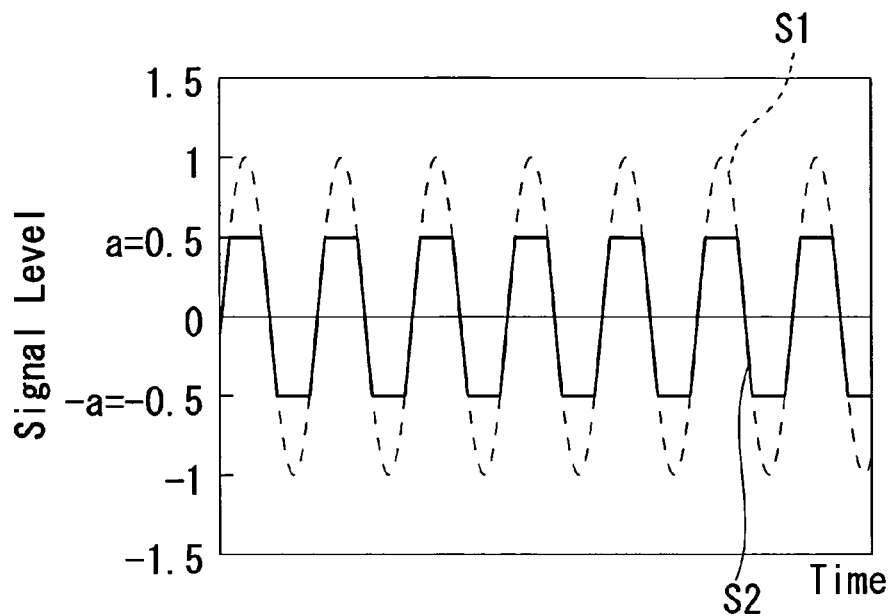
FIG. 6 shows a schematic view to explain the clip processing (2)

The up-sampling signal which is generated by up-sampling the music digital signal actually includes signal components of various frequencies. However, in the following, for example as shown in FIG. 6, a case in which the clip processing is performed for a digital signal S1 of sinusoidal wave of full scale configured by only a signal component of a single frequency (for example, 7 KHz) included in the up-sampling signal will be explained to make the understanding of the clip processing easy. In the clip processing, the first level (a) is set to 0.5, and the second level (−a) is set to −0.5.

As is apparent from FIG. 6, when performing the clip processing for the digital signal S1 such as a sinusoidal wave to arbitrarily restrict the level of the discrete data, the processing result signal S2 of digital having a waveform similar to a rectangular wave is obtained. Then, the processing result signal S2 of the waveform comes to be a signal which is configured by, on the digital signal S1 of frequency of original 7 KHz, overlapping higher harmonic waves of odd-order such as frequencies of 21 KHz, 35 KHz, and so forth which are obtained by multiplying the frequency by an odd number.

Figure 7:
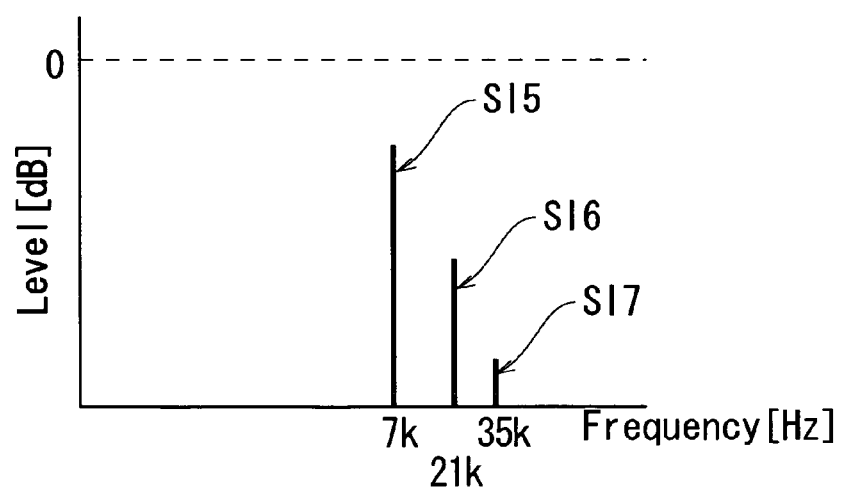
FIG. 7 shows a schematic view to explain the occurrence of higher harmonic waves of odd-order in the clip processing.

That is, when performing the clip processing for the digital signal S1, the clip processing unit 6C of the DSP 6 can generate signal components of higher harmonic waves of odd-order with the frequency of the digital signal S1 set to the basic frequency. Accordingly, as shown in FIG. 7, in the processing result signal S2 obtained by performing the clip processing for the digital signal S1, when expressing the signal component of the processing result signal S2 as spectrum, a signal component SI5 of frequency of 7 KHz as the digital signal S1 is included. Furthermore, in the processing result signal S2, such as frequencies of 21 KHz, 35 KHz, and so forth which are obtained by multiplying the frequency of 7 KHz as the digital signal S1 by an odd number, signal components SI6 and SI7 of higher harmonic waves of odd-order generated in the clip processing are included.

Figure 8:
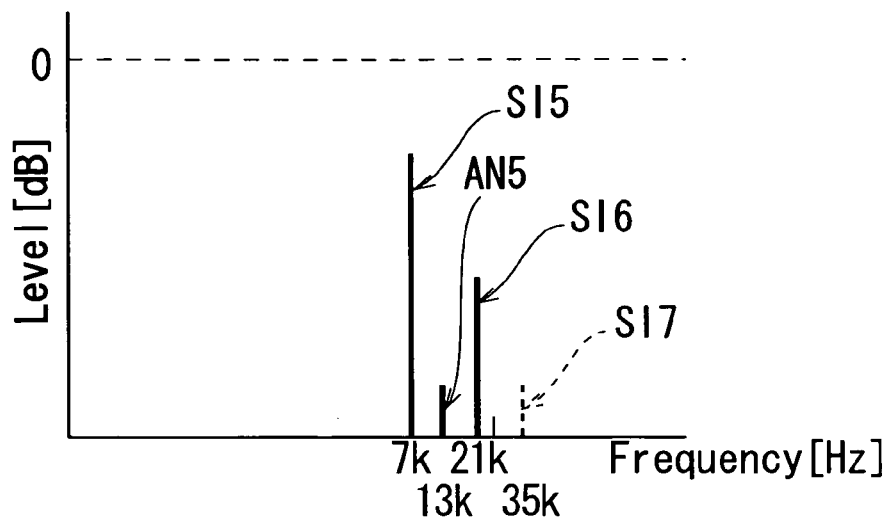
FIG. 8 shows a schematic view to explain a return noise generated in a processing result signal.

Then, as shown in FIG. 8, a case in which the DSP 6 operating with the first operation sampling frequency Fs1 of 48 KHz performs the clip processing for the digital signal of the first sampling rate without up-sampling the digital signal will be considered. In this case, in the processing result signal which is obtained by performing the clip processing for the digital signal of the first sampling rate, the signal component SI5 of frequency of 7 KHz as the digital signal (that is, signal component SI5 of frequency lower than the first return frequency which is ½ of the first operation sampling frequency Fs1) is included intact.

Furthermore, in the processing result signal, of the signal components SI6 and SI7 of higher harmonic waves of odd-order generated by the clip processing, the signal component SI6 of a higher harmonic wave (that is, 21 KHz) which is equal to or lower than the first return frequency is included intact. However, in the processing result signal, of the signal components SI6 and SI7 of higher harmonic waves of odd-order generated by the clip processing, the signal component SI7 of a higher harmonic wave (that is, 35 KHz) which is higher than the first return frequency is generated as a return noise AN5 which is returned with the first return frequency being the border and has its frequency converted to another frequency (that is, frequency of, for example, 13 KHz which is the symmetric position with respect to the higher harmonic wave with the first return frequency being the border). The return noise AN5 has an energy level equal to that of the original signal component S17 before being returned.

Accordingly, in the DSP 6 in this embodiment, the up-sampling processing unit 6B up-samples the music digital signal under an up-sampling rate which is two times the first sampling rate. Accordingly, the up-sampling processing unit 6B increases the number of data representing the music digital signal by two times, and generates an up-sampling signal of an up-sampling rate which finely express the music digital signal than the first sampling rate.

Furthermore, in the DSP 6, the clip processing unit 6C operates in synchronization with the cycle of the first operation sampling frequency Fs1 of 48 KHz. However, the clip processing unit 6C performs the clip processing by taking in discrete data of an up-sampling signal of an up-sampling rate with a timing (that is, every ¹⁄₄₈₀₀₀ second) of the clip processing of one time in synchronization with the cycle of the first operation sampling frequency Fs1 sequentially not by one but by two.

Accordingly, apparently, the clip processing unit 6C performs the clip processing by sequentially taking in one data with the cycle (that is, ¹⁄₉₆₀₀₀ second) of the second operation sampling frequency Fs2 of 96 KHz which is two times the first operation sampling frequency Fs1 of 48 KHz. Accordingly, while performing the clip processing for an up-sampling signal, the clip processing unit 6C raises the return frequency being the border where the return noise is generated, apparently, the second return frequency (that is, frequency of 48 KHz which is ½ of the second operation sampling frequency) which is two times the first return frequency.

Figure 9:
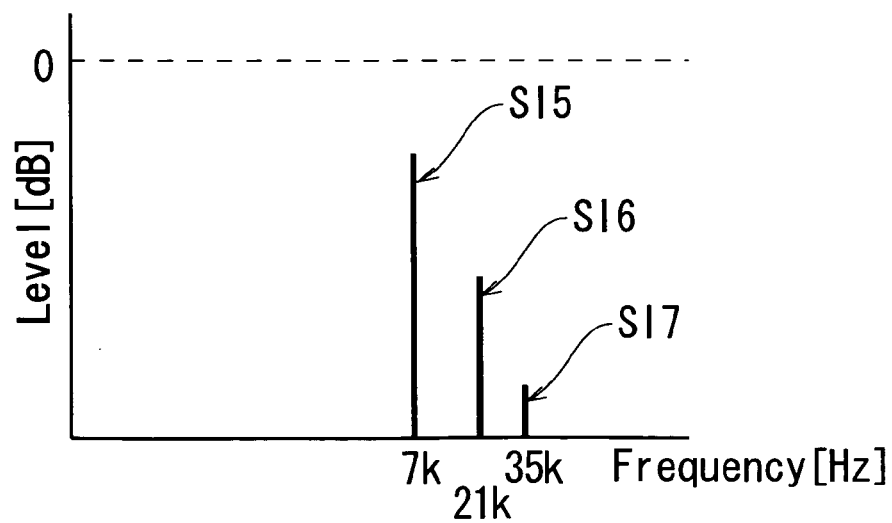
FIG. 9 shows a schematic view to explain the reduction of a return noise generated in a processing result signal.

As a result, as shown in FIG. 9, in the processing result signal obtained by performing the clip processing for the up-sampling signal, when expressing part of a signal component of the processing result signal as spectrum, for example, the signal component SI5 of a frequency of 7 KHz included in the up-sampling signal is inclined intact. Furthermore, in the processing result signal, of the signal components SI6 and SI7 of higher harmonic waves of odd-order generated by the clip processing, the signal components SI6 and SI7 of higher harmonic waves (that is, 21 KHz and 35 KHz) which are equal to or less than the second return frequency do not become the return noises and are included intact.

That is, in the processing result signal, of the signal components SI6 and SI7 of the higher harmonic waves of odd-order generated in the clip processing, even if the signal component SI7 of a higher harmonic wave which is higher than the first return frequency, when the signal component SI7 is equal to or less than the second return frequency, the signal component does not become the return noise and is included intact. In this way, as described above referring to FIG. 8, as compared with a case of not performing the up-sampling processing but performing the clip processing for the music digital signal of the first sampling rate, in the processing result signal, the clip processing unit 6C expresses various signal components of higher harmonic waves of odd-order in a wider frequency band without changing to the return noise. Accordingly, when performing the clip processing for the up-sampling signal, the clip processing unit 6C can considerably reduce the return noise generated in the processing result signal.

When performing the clip processing for an up-sampling signal, the clip processing unit 6C generates a signal component of higher harmonic waves of odd-order over a comparatively wide frequency band. Accordingly, in the clip processing unit 6C, when performing the clip processing for an up-sampling signal, for the processing result signal which is consequently obtained, the signal component of a higher harmonic wave which is higher than the second return frequency is generated as a return noise which is returned with the second return frequency being the border and has its frequency converted to another frequency (that is, frequency of the symmetric position with respect to the higher harmonic wave with the second return frequency being the border).

When the signal component of the higher harmonic wave of odd-order comes to be a return noise, the energy level thereof is not changed. However, in the signal component of the higher harmonic wave of odd-order, for example, as is apparent from FIG. 9, the higher the frequency is, the lower the level of energy becomes. Accordingly, even if the signal component of the higher harmonic wave which is higher than the second return frequency becomes the return noise which is returned with the second return frequency being the border and has its frequency converted to another frequency, since the level of energy is considerably low, the return noise is inconspicuous in the processing result signal.

Then, when generating the processing result signal by sequentially performing the clip processing for discrete two data of the up-sampling signal, as the processing result signal, the clip processing unit 6C sequentially sends two data obtained as the result of the clip processing to a down-sampling processing unit 6D at the subsequent stage. The down-sampling processing unit 6D performs the down-sampling processing for the processing result signal of the up-sampling rate sent from the clip processing unit 6C with the first sampling rate. Accordingly, the down-sampling processing unit 6D generates a music digital signal (referred to as down-sampling signal, hereinafter) which is down-sampled from the up-sampling rate to the down-sampling rate which is the first sampling rate.

Figure 10:
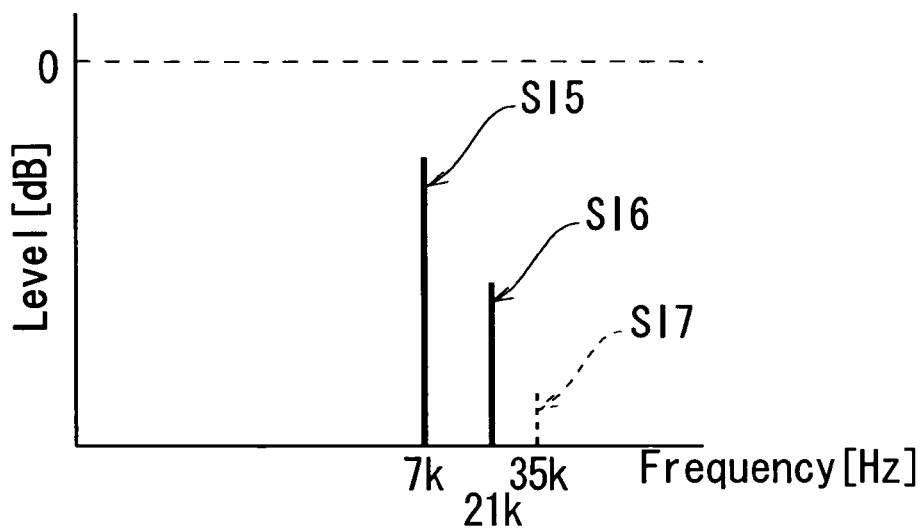
FIG. 10 shows a schematic view to explain the restriction of a frequency band in the down-sampling processing.

That is, as shown in FIG. 10, in synchronization with the cycle of the first operation sampling frequency, the down-sampling processing unit 6D sequentially takes in two discrete data of the processing result signal from the clip processing unit 6C, and makes the data pass through a digital lowpass filter for filtering. Accordingly, the down-sampling processing unit 6D removes the signal component of a frequency (for example, 35 KHz) which is higher than, for example, the first return frequency from the processing result signal.

Figure 11:
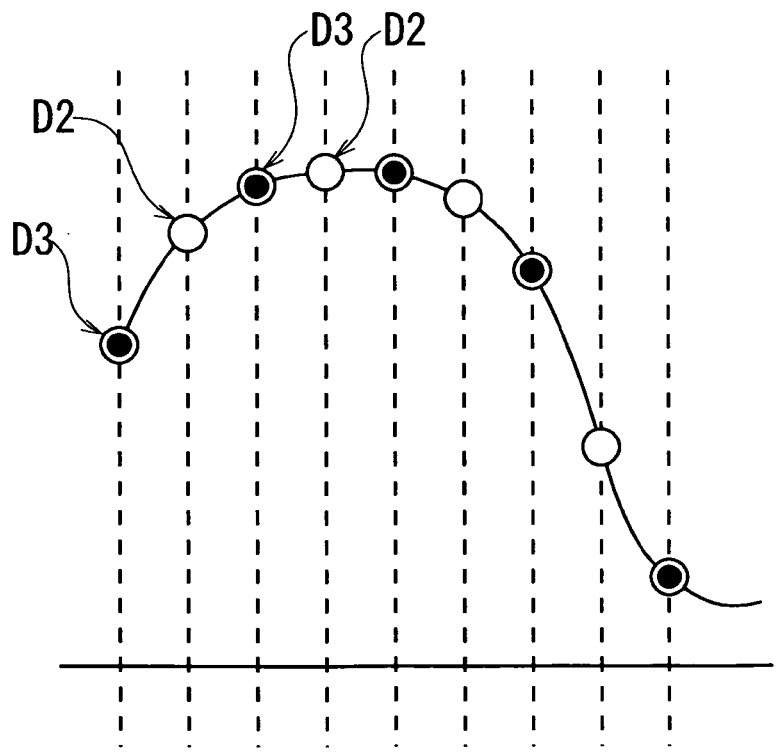
FIG. 11 shows a schematic view to explain the thinning processing in the down-sampling processing.

Next, as shown in FIG. 11, of the discrete data D2 and D3 of the processing result signal for which filtering processing is performed, the down-sampling processing unit 6D sequentially resamples the data D3 every other data. That is, of the discrete data D2 and D3 from the processing result signal, the down-sampling processing unit 6D sequentially thins the data D2 every other data. Accordingly, the down-sampling processing unit 6D generates a down-sampling signal of the first sampling rate which reduces the number of data of the processing result signal of the up-sampling rate to, for example, ½. Then, the down-sampling processing unit 6D sends thus generated down-sampling signal to an equalizer 6E.

The equalizer 6E performs the equalizing processing which arbitrarily adjusts the gain of the signal component of a specific frequency band for the down-sampling signal sent from the down-sampling processing unit 6D. Then, the equalizer 6E sends the music digital signal for which the equalizing processing is performed to an output unit 7 arranged at the subsequent stage of the DSP 6. The output unit 7 has a digital-to-analog converter, an amplifier, and plural loudspeakers arranged in a vehicle. Then, the output unit 7 performs the digital-to-analog conversion for the music digital signal sent from the DSP 6, and amplifies the resulting analog signal of music (referred to as music analog signal, hereinafter) using an amplifier, and sends thus amplified signal to the plural loudspeakers. Accordingly, the output unit 7 makes the plural loudspeakers output music based on the music analog signal respectively, so that a driver etc. in a vehicle can listen to the music.

Incidentally, under the MP 3 format utilized in the encode processing for the music digital signal, it is prescribed that the frequency band is restricted when performing the encode processing for the music digital signal so as to considerably reduce (compress) the information amount. That is, under the MP 3 format, for example, when compressing the music digital signal with a compression ratio of 64 Kbps, it is prescribed that, while signal components of a frequency band from approximately 0 KHz to 8 KHz are compressed to be encoded, signal components of a frequency band higher than the 8 KHz are deleted. Furthermore, under the MP 3 format, for example, when compressing the music digital signal with a compression ratio of 128 Kbps, it is prescribed that, while signal components of a frequency band from approximately 0 KHz to 16 KHz are compressed to be encoded, signal components of a frequency band higher than the 16 KHz are deleted.

Then, in the reproduction device 1, even if the decode processing is merely performed for the music digital signal for which the encode processing is performed in accordance with the MP3 format, signal components of high frequency which are deleted in the encode processing are unable to be compensated. That is, even if the reproduction device 1 merely performs the decode processing for the music digital signal for which the encode processing is performed in accordance with the MP3 format and outputs the resulting signal from the loudspeakers as music, a driver etc. in a vehicle is made to listen to music which has its high frequency sound missing.

When analyzing music, for example, a musical instrument generates a sound of a frequency particular to the musical instrument, and also generates sounds of frequencies of an even number and an odd number. Accordingly, by performing the clip processing for the music digital signal in the DSP 6, the reproduction device 1 in this embodiment can interpolate the lost signal components of high frequency when performing the encode processing for the music digital signal.

When directly performing the clip processing for the music digital signal of the first sampling rate, signal components of higher harmonic waves of odd-order generated in the clip processing are returned with the first return frequency which is ½ of the first operation sampling frequency being the border, and becomes a return noise of a frequency which is different from the frequency of odd-order or even-order. Then, when outputting the processing result signal including the return noise from the output unit 7 as music, the reproduction device 1 makes a driver etc. in a vehicle listen to the music including the noise.

Accordingly, as described above, the DSP 6 generates an up-sampling signal by performing the up-sampling processing for the music digital signal of the first sampling rate with an up-sampling rate at the preceding stage of the clip processing. In this way, while the DSP 6 actually operates with the first operation sampling frequency, and concurrently performs the clip processing for the up-sampling signal, apparently, the DSP 6 can perform the clip processing for the up-sampling signal as the music digital signal with the cycle of the second operation sampling frequency which is higher than the first operation sampling frequency. Accordingly, the DSP 6 makes the processing result signal obtained by the clip processing include signal components of higher harmonic waves of odd-order intact, which can considerably reduce the return noise generated in the processing result signal.

Figure 12A:
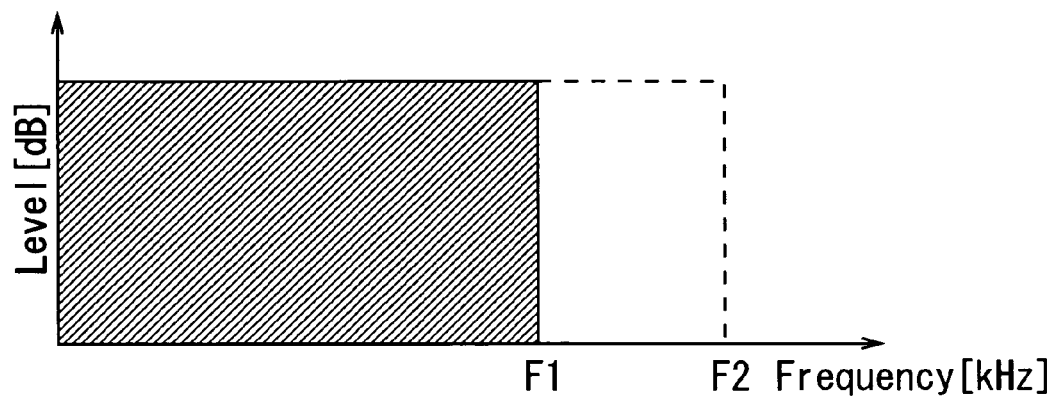
FIG. 12 shows a schematic view to explain the high frequency interpolation of a music digital signal in the clip processing.
Figure 12B:
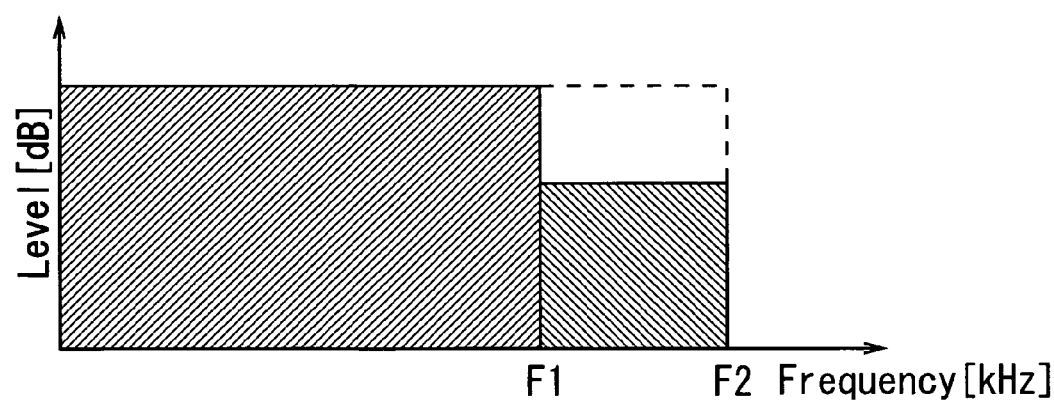

Then, by performing the down-sampling processing including the filtering processing and thinning processing for the processing result signal of the up-sampling rate, the DSP 6 generates a down-sampling signal of the first sampling rate. Accordingly, as shown in FIGS. 12A and 12B, the DSP 6 can interpolate signal components of a frequency band from a first frequency F1 such as 8 KHz and 16 KHz to a first return frequency F2 (that is, 24 KHz) which are lost when performing the encode processing for the music digital signal.

The signal components interpolated in a frequency band from the first frequency F1 to the first return frequency F2 in the music digital signal are signal components of higher harmonic waves of odd-order obtained by multiplying the frequencies of various signal components originally included in the music digital signal by an even number. Although it is difficult to say that a sound based on signal components of higher harmonic waves of odd-order is a sound itself of a frequency of odd-order generated by, for example, a musical instrument, since the sounds have the same frequency, these sounds are not different from each other, and are comparatively similar to each other. Accordingly, the reproduction device 1 outputs the music digital signal in which the signal components are interpolated in a frequency band from the first frequency F1 to the first return frequency F2 as music from the loudspeakers, which can make a driver etc. in a vehicle listen to the music which has its sound quality improved.

Next, using a flowchart shown in FIG. 13, a digital signal processing procedure RT1, under which the DSP 6 operates with the first operation sampling frequency, and executes the up-sampling processing, clip processing, and down-sampling processing in series will be explained. That is, for example, when performing output adjustment processing for the first data of discrete plural data of the music digital signal, the DSP 6 obtains the data and temporarily retains the data. Then, every time the output adjustment processing is performed for the second data or later of discrete plural data of the music digital signal, DSP 6 starts the digital signal processing procedure RT1 shown in FIG. 13 in accordance with a digital signal processing program. When starting the digital signal processing procedure RT1, in step SP1, the DSP 6 obtains one data from the second or subsequent data of the music digital signal for which the output adjustment processing is performed and temporarily retains the data, and goes to next step SP2.

In step SP2, the DSP 6 calculates data of the intermediate value between the value of data which has been taken in previous time and temporarily retained and the value of data which is taken in this time. In this way, the DSP 6 interpolates data of the intermediate value between the data taken in previous time and the data taken in this time of the music digital signal, and generates an up-sampling signal which is obtained by performing the up-sampling processing for the music digital signal from the first sampling rate to an up-sampling rate of two times, and goes to step SP3 and step SP4. While performing the up-sampling processing for the music digital signal, the DSP 6 performs the clip processing for the original data as the up-sampling signal and interpolated data concurrently and parallelly in step SP3 and step SP4 through operating with the first operation sampling frequency.

That is, in step SP3, the DSP 6 performs the clip processing for original one data as, for example, an up-sampling signal, and goes to next step SP5. Furthermore, in step SP4, the DSP 6 performs the clip processing also for one data interpolated as the up-sampling signal, and goes to next step SP5. Then, in step SP5, for two data as the processing result signal which is obtained as a result of performing the clip processing for two data as the up-sampling signal concurrently and parallelly, the DSP 6 sequentially executes the filtering processing to make the data pass through a digital low-pass filter, and thinning processing to sample only one data and thin the other data. In this way, the DSP 6 generates one data as the down-sampling signal by performing the down-sampling processing for the processing result signal from the up-sampling rate to the first sampling rate of ½, and goes to step SP6. Accordingly, in step SP6, the DSP 6 ends the digital signal processing procedure RT1.

In this way, every time the output adjustment processing is performed for the second or subsequent data of the discrete plural data of the music digital signal, the DSP 6 executes the digital signal processing procedure RT1 in accordance with a digital signal processing program. Then, while the DSP 6 operates with the first operation sampling frequency and concurrently executes the digital signal processing procedure RT1, DSP 6 sequentially executes the clip processing for the up-sampling signal of an up-sampling rate with respect to two data concurrently and parallelly. Accordingly, apparently, the DSP 6 can execute only the clip processing with the cycle of the second operation sampling frequency which is two times the first operation sampling frequency. Accordingly, even if the operation sampling frequency is not set high for the entirety or for only the clip processing, the DSP 6 can considerably reduce a return noise generated in the processing result signal in the clip processing.

In the above-described configuration, in the reproduction device 1, the DSP 6 generates an up-sampling signal by performing the up-sampling processing for the music digital signal of the first sampling rate with an up-sampling rate which is two times the first sampling rate. Then, in the reproduction device 1, the DSP 6 performs the clip processing while sequentially obtaining discrete data of an up-sampling signal by two, restricting that, at the plus side of the up-sampling signal, the level of data which is higher than the first level is attached to the first level, and also restricting that, at the minus side, the level of data which is lower than the second level is attached to the second level. In this way, in the reproduction device 1, after generating signal components of higher harmonic waves of odd-order configured by a frequency which is odd-order times the original frequency with respect to the processing result signal of the up-sampling rate obtained as the result of the clip processing, the DSP 6 generates a down-sampling signal by performing the down-sampling processing for the processing result signal with the first sampling rate which is ½ of the up-sampling rate.

Accordingly, in the reproduction device 1, since the DSP 6 performs the up-sampling processing for the music digital signal at the preceding stage of the clip processing to increase the number of data, and performs the down-sampling processing for the processing result signal at the subsequent stage of the clip processing to decrease the number of data, apparently only the clip processing can be executed with the cycle of the second operation sampling frequency which is two times the primary first operation sampling frequency.

In the above-described configuration, in the reproduction device 1, the DSP 6 performs the up-sampling processing for the music digital signal of the first sampling rate with the up-sampling rate to generate the up-sampling signal, and performs the clip processing under which a return noise is generated in the processing result signal for the up-sampling signal to generate the processing result signal, and performs the down-sampling processing for the processing result signal with the down-sampling rate which is the first sampling rate to generate the down-sampling signal. Accordingly, in the reproduction device 1, the DSP 6 performs the up-sampling processing for the music digital signal at the preceding stage of the clip processing to increase the number of data, and performs the down-sampling processing for the processing result signal at the subsequent stage of the clip processing to decrease the number of data. In this way, apparently only the clip processing can be executed with the cycle of the second operation sampling frequency which is higher than the primary first operation sampling frequency. Accordingly, in the reproduction device 1, the DSP 6 can considerably reduce the return noise generated in the processing result signal in the clip processing without wastefully increasing the processing load.

Furthermore, in the reproduction device 1, after performing the up-sampling processing for the music digital signal, the DSP 6 performs the clip processing, and performs the down-sampling processing for the resulting processing result signal. Accordingly, the reproduction device 1 can considerably reduce the return noise generated in the music digital signal, and interpolate the lost signal components of high frequency of the music digital signal.

In the above-described embodiment, the DSP 6 performs the up-sampling processing for the music digital signal with the up-sampling rate, and then executes the clip processing as the specific signal processing under which the return noise is generated in the processing result signal. However, the present invention is not restricted thereto. Other various specific signal processing may be executed such as specific signal processing in which, after performing the up-sampling processing for the music digital signal with the up-sampling rate, as the specific signal processing under which the return noise is generated in the processing result signal, by performing n-power (for example, squaring or cubing) for the resulting up-sampling signal, signal components of higher harmonic waves of high order such as frequency of n-times (for example, two times or three times) the original frequency is generated in addition to the signal components of the original frequency. Then, when executing the specific signal processing, the up-sampling processing is executed at the preceding stage of the specific signal processing, and the down-sampling processing is executed at the subsequent stage of the specific signal processing, which can provide the same effect as that of the above-describe embodiment.

Figure 13:
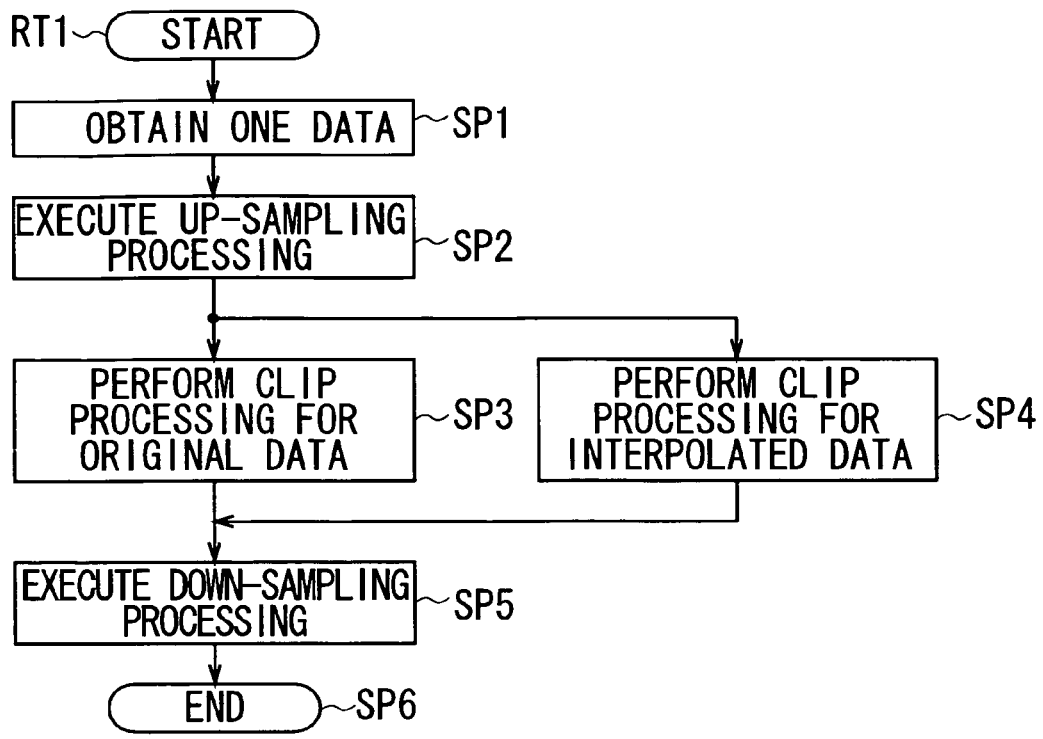
FIG. 13 shows a flowchart indicative of a digital signal processing procedure.

In the above-described embodiment, a compressed encoded digital signal encoded in accordance with the MP3 format is decoded, and the digital signal processing described in FIG. 13 is performed for the resulting music digital signal. However, the present invention is not restricted thereto. There may be employed a configuration in which a compressed encoded digital signal encoded in accordance with various formats such as the Adaptive Transform Acoustic Coding 3 (ATRAC 3) format, Advance Audio Coding (AAC) format, Windows (registered trademark) Media Audio (WMA) format, RealAUDIO G2 Music Codec format is decoded, and the digital signal processing described referring to FIG. 13 is performed for the resulting music digital signal, or a digital signal of music or sound for which the encode processing or decode processing is not performed such as the PCM format.

Furthermore, in the above-described embodiment, the clip processing is fixedly performed for the music digital signal. However, the present invention is not restricted thereto. There may be employed a configuration in which, for example, the user is made to arbitrarily select whether or not the clip processing is to be executed, and, only when it is selected that the clip processing is to be performed by the user, the clip processing is performed for the music digital signal.

Figure 14:
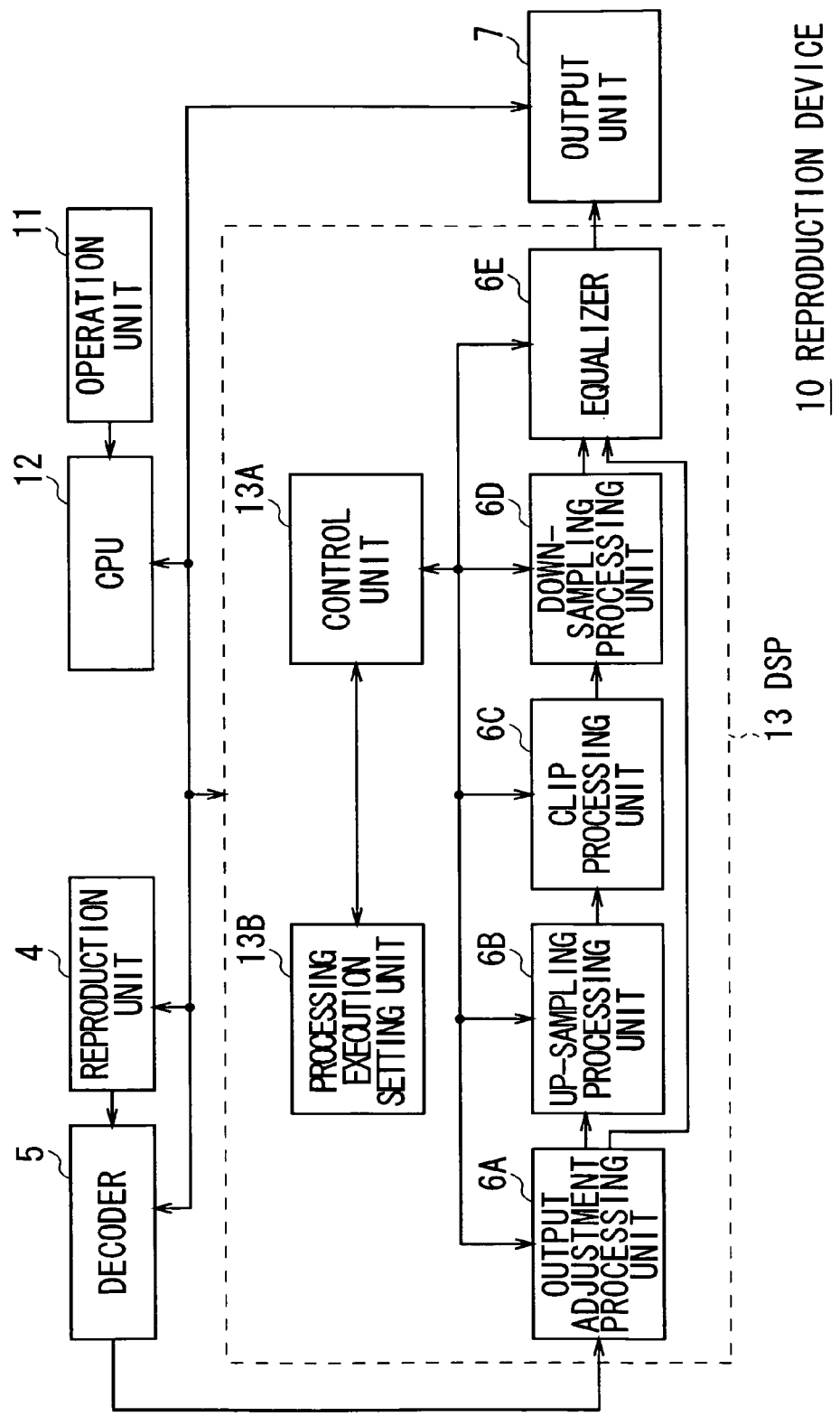
FIG. 14 shows a block diagram indicative of the circuit configuration of a reproduction device according to another embodiment of the present invention.

Actually, as shown in FIG. 14 in which parts or components corresponding to those in FIG. 3 are indicated with the same reference numerals, in a reproduction device 10 of such a configuration, the housing of the reproduction device 10 has arranged thereon selection keys as an operation unit 11 to select whether or not the clip processing is to be executed. In the reproduction device 10, when it is selected to execute the clip processing by the user operation with respect to the selection keys, a CPU 12 sends the selection contents to a DSP 13. Furthermore, when it is selected not to execute the clip processing by the user operation with respect to the selection keys, the CPU 12 sends the selection contents to the DSP 13. The DSP 13 realizes various functions in accordance with various programs. However, in the following, for the sake of convenience, in the DSP 13, a functional unit that controls the entire DSP 13 is denoted as a control unit 13A in the functional block, and a functional unit that sets whether or not the clip processing is to be executed is denoted as a processing execution setting unit 13B in the functional block.

In the DSP 13, in case the selection contents shows that the clip processing is to be executed is selected, the processing execution setting unit 13B sets the clip processing to be executed in accordance with the selection contents of whether or not the clip processing is to be executed which is notified from the CPU 12. Furthermore, in case the selection contents notified from the CPU 12 shows that the clip processing is not to be executed is selected, the processing execution setting unit 13B sets the clip processing not to be executed. Then, when setting whether or not the clip processing is to be executed, afterward, the processing execution setting unit 13B maintains the setting contents for a time period until new selection contents are sent from the CPU 12.

In this state, when a compressed encoded digital signal is read out from an optical disc by the reproduction unit 4, and is sent to the decoder 5 as a music digital signal, the control unit 13A confirms the setting contents whether or not the set clip processing will be executed by the processing execution setting unit 13B. As a result, in case it is set that the clip processing will be executed by the processing execution setting unit 13B, the control unit 13A controls the up-sampling processing unit 6B, clip processing unit 6C, and down-sampling processing unit 6D so that the up-sampling processing, clip processing, and down-sampling processing will be executed. Furthermore, the control unit 13A controls the output adjustment processing unit 6A so that the music digital signal is sent to the up-sampling processing unit 6B.

On the other hand, in case it is set that the clip processing will not be executed by the processing execution setting unit 13B, the control unit 13A controls the up-sampling processing unit 6B, clip processing unit 6C, and down-sampling processing unit 6D so that the up-sampling processing, clip processing, and down-sampling processing will not be executed. Furthermore, the control unit 13A controls the output adjustment processing unit 6A so that the music digital signal passes over the up-sampling processing unit 6B, clip processing unit 6C, and down-sampling processing unit 6D, and is sent to the equalizer 6E. Accordingly, in the reproduction device 10, it becomes possible to execute the clip processing, or not to execute the clip processing according to the desire of the user.

Furthermore, in the above-described embodiment, the DSP 6 performs the up-sampling processing for the music digital signal of the first sampling rate with an up-sampling rate of two times. However, the present invention is not restricted thereto. The DSP 6 may perform the up-sampling processing for the music digital signal of the first sampling rate with an up-sampling rate of N times which is larger than two times.

Figure 15:
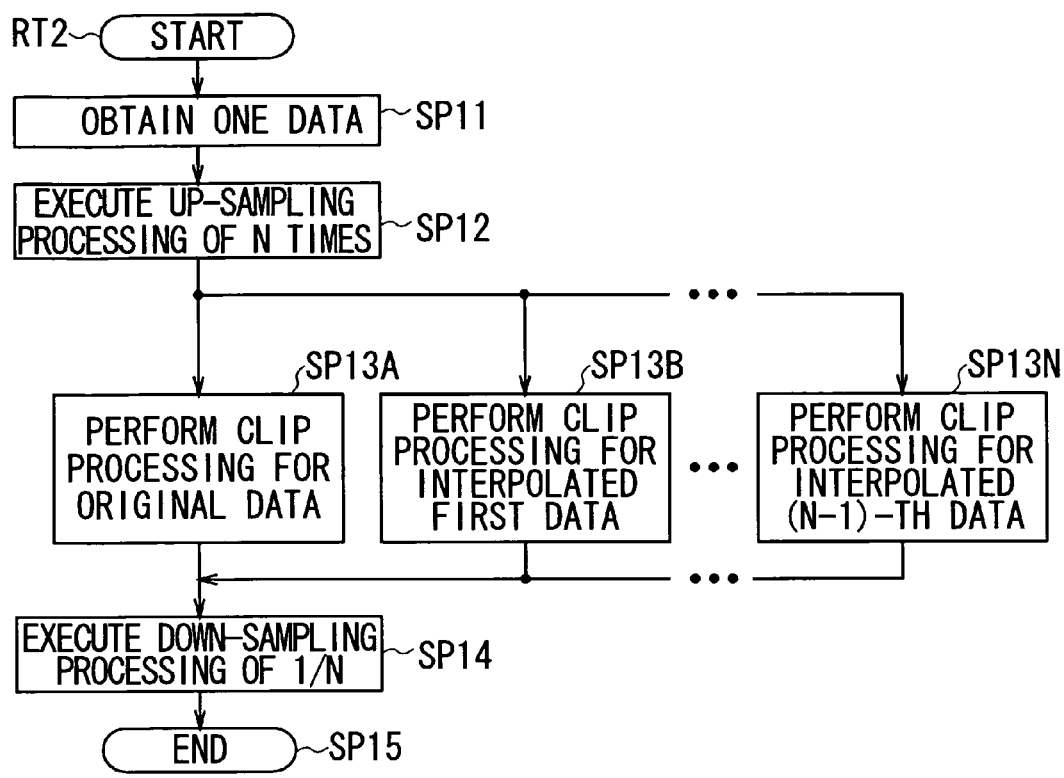
FIG. 15 shows a flowchart indicative of a digital signal processing procedure according to another embodiment.

In case of this configuration, for example, when performing the output adjustment processing for the first data of the discrete plural data of the music digital signal, the DSP 6 obtains the data and temporarily retains the data. Then, every time the output adjustment processing is performed for the second or subsequent data of the discrete plural data of the music digital signal, the DSP 6 starts a digital signal processing procedure RT2 shown in FIG. 15 in accordance with a digital signal processing program. When starting the digital signal processing procedure RT2, in step SP11, the DSP 6 obtains one data of the second or subsequent data of the music digital signal for which the output adjustment processing is performed and temporarily retains the data, and goes to the next step SP12.

In step SP12, for example, the DSP 6 calculates (N−1) pieces of data between the value of data which has been obtained previous time and temporarily retained and the value of data which is obtained this time. Accordingly, the DSP 6 interpolates (N−1) pieces of data between data of the music digital signal which has been obtained previous time and data thereof which is obtained this time, and generates an up-sampling signal which is obtained by performing the up-sampling processing for the music digital signal from the first sampling rate to an up-sampling rate of N times, and goes to the next step SP13A to step SP13N. While performing the up-sampling processing for the music digital signal, the DSP 6 performs the clip processing for the original data as the up-sampling signal and interpolated (N−1) pieces of data concurrently and parallelly in step SP13A to step SP13N through operating with the first operation sampling frequency.

That is, in step SP13A, for example, the DSP 6 performs the clip processing for original one data as the up-sampling signal, and goes to next step SP14. Furthermore, in step SP13B to step SP13N, the DSP 6 performs the clip processing also for interpolated one to (N−1) pieces of data as the up-sampling signal respectively, and goes to next step SP14. Then, in step SP14, for N pieces of data as the processing result signal obtained as the result of performing the clip processing for N pieces of data as the up-sampling signal concurrently and parallelly, the DSP 6 sequentially executes the filtering processing to make the data pass through a digital low-pass filter, and thinning processing to sample only one data and thin the other (N−1) pieces of data. Accordingly, the DSP 6 performs the down-sampling processing for the processing result signal from the up-sampling rate to the first sampling rate of 1/N, and generates one data as the down-sampling signal, and goes to next step SP15. Accordingly, the DSP 6 ends the digital signal processing procedure RT2 in step SP15.

In this way, every time the output adjustment processing is performed for the second or subsequent data of the discrete plural data of the music digital signal, the DSP 6 executes the digital signal processing procedure RT2 in accordance with a digital signal processing program. Then, while the DSP 6 operates with the first operation sampling frequency and executes the digital signal processing procedure RT2, the DSP 6 sequentially executes the clip processing with respect to the up-sampling signal of the up-sampling rate for N pieces of data concurrently and parallelly. Accordingly, apparently, the DSP 6 can execute only the clip processing with the cycle of the operation sampling frequency of N times of the first operation sampling frequency. Accordingly, the DSP 6 can considerably reduce the return noise generated in the processing result signal in the clip processing without setting the operation sampling frequency high for the entirety or for only the clip processing in this configuration.

In the above-described embodiment, the DSP 6 performs the down-sampling processing for the processing result signal of the up-sampling rate with the first sampling rate. However, the present invention is not restricted thereto. The DSP 6 may perform the down-sampling processing for the processing result signal of the up-sampling rate with a predetermined down-sampling rate which is lower than the sampling rate of the music digital signal.

Furthermore, in the above-described embodiment, the DSP 6 operates in synchronization with the cycle of the first operation sampling frequency of 48 KHz. However, the present invention is not restricted thereto. The DSP 6 may operate in synchronization with the cycle of other various operation sampling frequencies such as 44.1 KHz.

Figure 16A:
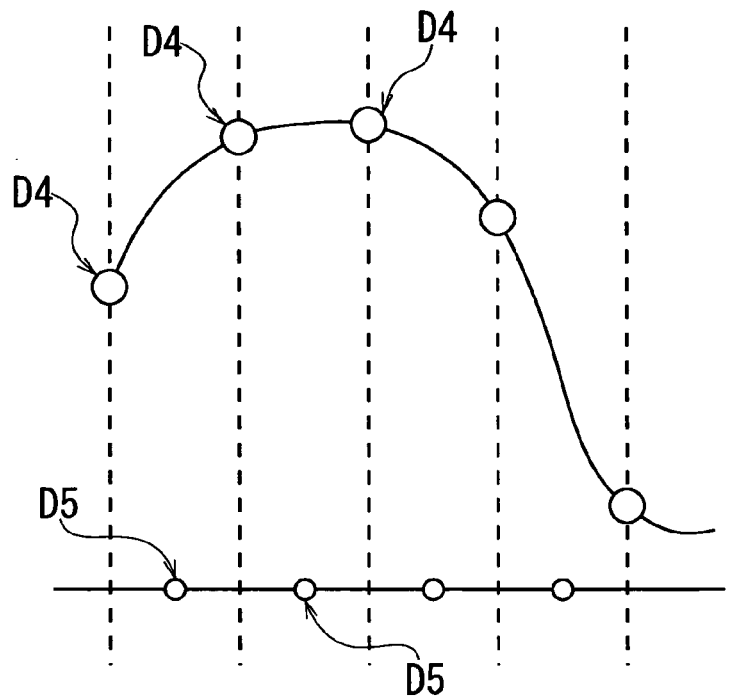
FIG. 16 shows a schematic view to explain the up-sampling processing according to another embodiment.
Figure 16B:
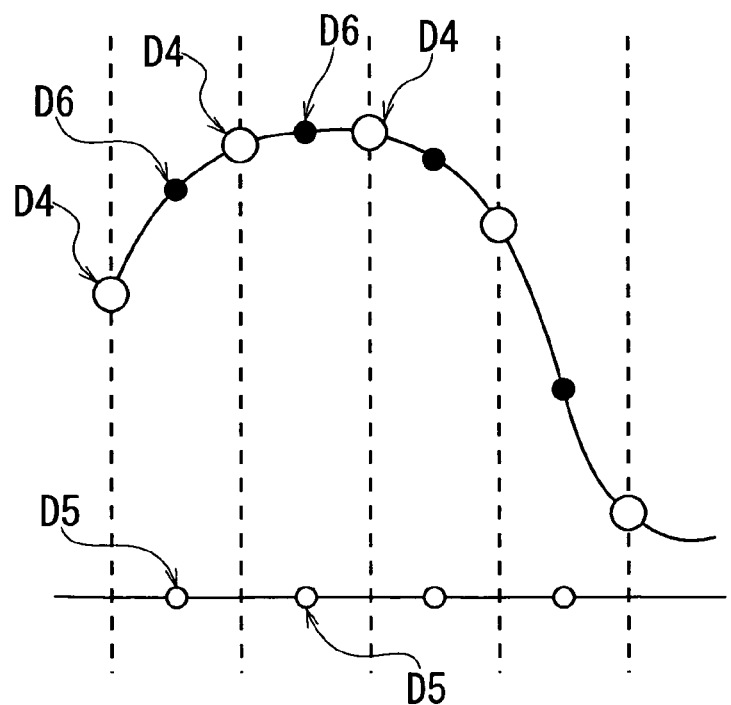

Furthermore, in the above-described embodiment, the DSP 6 calculates data of intermediate value of sequentially neighboring two data of the music digital signal, and interpolates thus calculated data of intermediate value between the neighboring two data to perform the up-sampling processing for the music digital signal of the first sampling rate in the software manner. However, the present invention is not restricted thereto. As shown in FIG. 16A and FIG. 16B, there may be employed a configuration in which, after inserting data D5 whose value is zero between sequentially neighboring two data D4 in the music digital signal respectively, by performing the filtering processing to make the data pass through a digital low-pass filter, the DSP 6 interpolates data D6 between the sequentially neighboring two data D4 of the music digital signal of the first sampling rate to perform the up-sampling processing for the music digital signal in the software manner.

Figure 17:
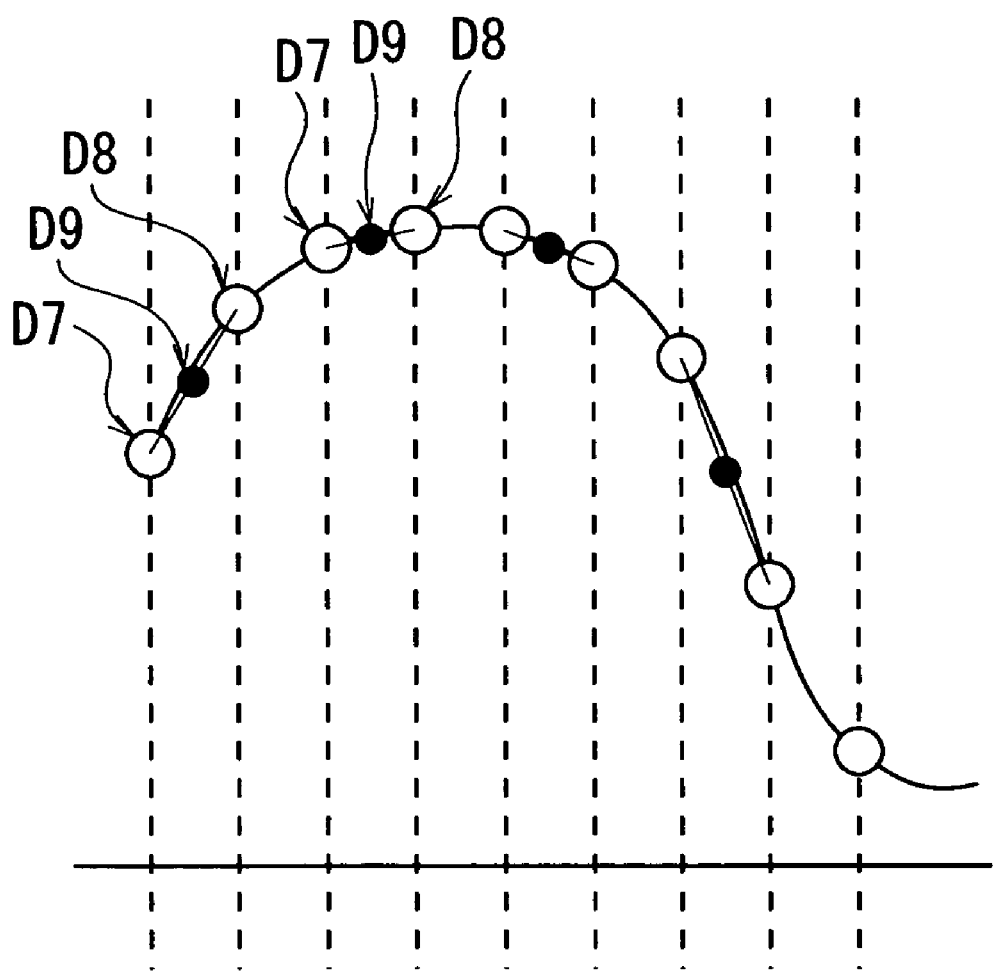
FIG. 17 shows a schematic view to explain the down-sampling processing according to another embodiment.

Furthermore, in the above-described embodiment, after performing the filtering processing to make the processing result signal pass through a digital low-pass filter, the DSP 6 performs the thinning processing to resample discrete data of the processing result signal alternately in series to perform the down-sampling processing for the processing result signal of the up-sampling rate in the software manner, to which the present invention is not restricted. As shown in FIG. 17, there may be employed a configuration in which, after performing the filtering processing to make the processing result signal pass through a digital low-pass filter, the DSP 6 calculates data D9 of intermediate value between sequential two data D7 and D8 in the processing result signal, and resamples only thus calculated data D9 of intermediate value to perform the down-sampling processing for the processing result signal of the up-sampling rate in the software manner.

Furthermore, in the above-described embodiment, the DSP 6 executes the output adjustment processing at the preceding stage of the up-sampling processing, and executes the equalizing processing at the subsequent stage of the down-sampling processing. However, the present invention is not restricted thereto. There may be employed a configuration in which the DSP 6 executes the equalizing processing at the preceding stage of the up-sampling processing, and executes the output adjustment processing at the subsequent stage of the down-sampling processing, or executes the output adjustment processing and equalizing processing collectively at the preceding stage of the up-sampling processing or at the subsequent stage of the down-sampling processing.

Furthermore, in the above-described embodiment, the DSP 6 takes in the music digital signal which is obtained when the decoder 5 decodes a compressed encoded digital signal. However, the present invention is not restricted thereto. The DSP 6 may take in and decode a compressed encoded digital signal to generate the music digital signal.

Furthermore, in the above-described embodiment, the DSP 6 executes the digital signal processing procedure RT1 described referring to FIG. 13 in accordance with a digital signal processing program stored in a memory arranged at the inside thereof. However, the present invention is not restricted thereto. There may be employed a configuration in which, a program storage medium having stored therein a digital signal processing program is installed to the reproduction device 1, and the DSP 6 executes the digital signal processing procedure RT1 described referring to FIG. 13 in accordance with a digital signal processing program stored in the program storage medium.

As a program storage medium which installs a digital signal processing program to the reproduction device 1, and makes the program executable, for example, there are package media such as a flexible disc, a Compact Disc-Read Only Memory (CD-ROM), and a Digital Versatile Disc (DVD), and furthermore, a semiconductor memory, a magnetic disc, etc. in which various programs are temporarily or permanently stored may also be employed. Furthermore, as means to store a digital signal processing program in a program storage medium, wired and wireless communication media such as a local area network, the Internet, Digital Satellite Broadcasting can be utilized, and the program may be stored through various communication interfaces such as a router or a modem.

Furthermore, in the above-described embodiment, the digital signal processing device according to an embodiment of the present invention is applied to the DSP 6 and DSP 13 described referring to FIGS. 1 to 17. However, the present invention is not restricted thereto. The present invention can be applied to digital signal processing devices of other various configurations widely such as a circuit substrate on which a CPU, a microprocessor, and at least an up-sampling processing unit, a clip processing unit (that is, a specific signal processing unit that executes specific signal processing under which a return noise is generated in a processing result signal), and a down-sampling processing unit of hardware configuration which operate with an identical operation sampling frequency are arranged, or a circuit substrate on which at least an up-sampling processing unit, a clip processing unit (that is, a specific signal processing unit that executes specific signal processing under which a return noise is generated in a processing result signal), a down-sampling processing unit of hardware configuration, a control unit, and a processing execution setting unit which operates with an identical operation sampling frequency are arranged.

Furthermore, the digital signal processing device of these various configurations may be arranged in a reproduction device to be mounted on a vehicle, or may be arranged in an information processing device such as a personal computer, a cellular phone, a Personal Digital Assistance (PDA), a game machine, and a vehicle navigation device, and a recording/reproduction device such as a stationary hard disc recorder and a DVD recorder, and a reproduction device such as a stationary CD player, and other various devices.

Furthermore, in the above-described embodiment, as a digital signal for which the digital signal processing device performs the digital signal processing, the music digital signal described referring to FIGS. 1 to 17 is employed. However, the present invention is not restricted thereto. Other various digital signals such as a digital signal of sound which is generated by collecting ambient sounds, a digital signal of sound of a movie or a television program, etc., can be widely employed.

Furthermore, in the above-described embodiment, as the up-sampling processing unit that performs the up-sampling processing for a digital signal with a predetermined up-sampling rate to generate an up-sampling signal, the DSP 6 and DSP 13 described referring to FIGS. 1 to 17 are employed. However, the present invention is not restricted thereto. Other various up-sampling processing units such as a CPU, a microprocessor, and an up-sampling processing unit of hardware configuration that performs the up-sampling processing for a digital signal with a predetermined up-sampling rate to generate the up-sampling signal can be widely employed.

Furthermore, in the above-described embodiment, as the specific signal processing unit that performs the specific signal processing for the up-sampling signal generated by the up-sampling processing unit to generate the processing result signal, the DSP 6 and DSP 13 described referring to FIGS. 1 to 17 are employed. However, the present invention is not restricted thereto. Other various specific signal processing units such as a CPU, a microprocessor, and a specific signal processing unit of hardware configuration that performs the specific signal processing under which the return noise is generated in the processing result signal for the up-sampling signal generated by the up-sampling processing unit to generate the processing result signal can be widely employed.

Furthermore, in the above-described embodiment, as the down-sampling processing unit that performs the down-sampling processing for the processing result signal generated by the specific signal processing unit with a predetermined down-sampling rate to generate the down-sampling signal, the DSP 6 and DSP 13 described referring to FIGS. 1 to 17 are employed. However, the present invention is not restricted thereto. Other various down-sampling processing units such as a CPU, a microprocessor, and a down-sampling processing unit of hardware configuration that performs the down-sampling processing for the processing result signal generated by the specific signal processing unit with a predetermined down-sampling rate to generate the down-sampling signal can be widely employed.

Furthermore, in the above-described embodiment, as the processing execution setting unit to set whether or not the specific signal processing is to be executed, the DSP 6 and DSP 13 described referring to FIGS. 1 to 17 are employed. However, the present invention is not restricted thereto. Other various processing execution setting units such as a CPU, a microprocessor, and a processing execution setting unit of hardware configuration that sets whether or not the specific signal processing is to be executed can be widely employed.

Furthermore, in the above-described embodiment, as a control unit that, in case it is set that the specific signal processing is to be executed by the processing execution setting unit, controls the up-sampling processing unit, specific signal processing unit, and down-sampling processing unit so that the up-sampling processing, specific signal processing, and down-sampling processing are executed, and, in case it is set that the specific signal processing is not to be executed by the processing execution setting unit, controls the up-sampling processing unit, specific signal processing unit, and down-sampling processing unit so that the up-sampling processing, specific signal processing, and down-sampling processing are not executed, the DSP 6 and DSP 13 described referring to FIGS. 1 to 17 are employed. However, the present invention is not restricted thereto. Other various control units such as a CPU, a microprocessor, and a control unit of hardware configuration that, in case it is set that the specific signal processing is to be executed by the processing execution setting unit, controls the up-sampling processing unit, specific signal processing unit, and down-sampling processing unit so that the up-sampling processing, specific signal processing, and down-sampling processing are executed, and, in case it is set that the specific signal processing is not to be executed by the processing execution setting unit, controls the up-sampling processing unit, specific signal processing unit, and down-sampling processing unit so that the up-sampling processing, specific signal processing, and down-sampling processing are not executed can be widely employed.

The present invention can be utilized for a digital signal processing device such as a reproduction device to be mounted on a vehicle or a DSP arranged in a personal computer.

It should be understood by those skilled in the art that various modifications, combinations, sub-combinations and alterations may occur depending on design requirements and other factors insofar as they are within the scope of the appended claims or the equivalents thereof.

What is claimed is:

1. A digital signal processing device that executes specific signal processing under which a return noise is generated in a processing result signal, comprising:
    an up-sampling processing unit to perform up-sampling processing for a digital signal with a predetermined up-sampling rate to generate an up-sampling signal;
    a specific signal processing unit to perform the specific signal processing for the up-sampling signal generated by the up-sampling processing unit to generate the processing result signal;
    a down-sampling processing unit to perform down-sampling processing for the processing result signal generated by the specific signal processing unit with a predetermined down-sampling rate to generate a down-sampling signal;
    a processing execution setting unit that sets whether the specific signal processing is to be executed; and
    a control unit that, in case the processing execution setting unit is set to execute the specific signal processing, controls the up-sampling processing unit, the specific signal processing unit, and the down-sampling processing unit to execute the up-sampling processing, the specific signal processing, and the down-sampling processing, and, in case the processing execution setting unit is set not to execute the specific signal processing, controls the up-sampling processing unit, the specific signal processing unit, and the down-sampling processing unit not to execute the up-sampling processing, the specific signal processing, and the down-sampling processing.

2. The digital signal processing device according to claim 1, wherein
    by performing the specific signal processing for the up-sampling signal, the specific signal processing unit generates the processing result signal including a first signal component of a first frequency included in the digital signal and a second signal component of a second frequency higher than the first frequency.

3. The digital signal processing device according to claim 2, wherein
    with respect to the up-sampling signal, by performing the specific signal processing of restricting data whose level is higher than a predetermined first level to the first level, and restricting data whose level is lower than a second level, which is lower than the first level, to the second level, the specific signal processing unit generates the processing result signal including the first signal component of the first frequency included in the digital signal and the second signal component of the second frequency higher than the first frequency.

4. The digital signal processing device according to claim 2, wherein
    by performing the specific signal processing including at least one exponentiation operation on the up-sampling signal, the specific signal processing unit generates the processing result signal including the first signal component of the first frequency included in the digital signal and the second signal component of the second frequency higher than the first frequency.

5. The digital signal processing device according to claim 1, wherein
    the down-sampling processing unit performs the down-sampling processing for the processing result signal with the predetermined down-sampling rate which is equal to a sampling rate of the digital signal to generate the down-sampling signal of the sampling rate which is equal to the sampling rate of the digital signal.

6. The digital signal processing device according to claim 1, wherein
    the down-sampling processing unit performs the down-sampling processing for the processing result signal with the predetermined down-sampling rate which is lower than a sampling rate of the digital signal to generate the down-sampling signal of the sampling rate which is lower than the sampling rate of the digital signal.

* * * * *